US012699140B2

(12) United States Patent
Gu et al.

(10) Patent No.: US 12,699,140 B2
(45) Date of Patent: Aug. 4, 2026

(54) METHOD AND SYSTEM FOR STEP PARAMETER IDENTIFICATION BASED ON ELECTROCHEMICAL MODEL

(71) Applicant: Makesense Energy Technology Co., Limited., Shanghai (CN)

(72) Inventors: Danfei Gu, Shanghai (CN); Qian Li, Shanghai (CN); Siyuan Chen, Shanghai (CN); Mingchen Jiang, Shanghai (CN); Jie Zhang, Shanghai (CN); Xiao Yan, Shanghai (CN); Enhai Zhao, Shanghai (CN)

(73) Assignee: Makesense Energy Technology Co., Limited., Shanghai (CN)

( * ) Notice: Subject to any disclaimer, the term of this patent is extended or adjusted under 35 U.S.C. 154(b) by 367 days.

(21) Appl. No.: 18/371,575

(22) Filed: Sep. 22, 2023

(65) Prior Publication Data

US 2024/0133958 A1     Apr. 25, 2024

(30) Foreign Application Priority Data

Sep. 23, 2022    (CN) ........................... 202211164115.5

(51) Int. Cl.
G01R 31/367 (2019.01)

(52) U.S. Cl.
CPC ................................. G01R 31/367 (2019.01)

(58) Field of Classification Search
CPC ... B60L 58/12; G01R 31/3648; G01R 31/367; H01M 10/0525; H01M 10/44
See application file for complete search history.

(56) References Cited

U.S. PATENT DOCUMENTS

| | | | | |
|---|---|---|---|---|
| 10,829,004 B1 * | 11/2020 | Han | ..................... | H01M 10/44 |
| 11,579,201 B2 * | 2/2023 | He | ..................... | G01R 31/3648 |
| 2016/0023566 A1 * | 1/2016 | Lee | ......................... | B60L 58/12 |
| | | | | 429/61 |
| 2016/0023569 A1 * | 1/2016 | Lee | ......................... | B60L 58/12 |
| | | | | 429/61 |
| 2017/0190262 A1 * | 7/2017 | Jin | .................... | H01M 10/0525 |

* cited by examiner

*Primary Examiner* — Lam S Nguyen
(74) *Attorney, Agent, or Firm* — troutman pepper locke; Tim Tingkang Xia, Esq.

(57) ABSTRACT

The invention discloses a method for step parameter identification based on an electrochemical model, including: identifying a first type of electrochemical parameters through a reduced-order electrochemical model by utilizing different preset charge-discharge rate data; determining a first type of target electrochemical parameters identified by the reduced-order electrochemical model through extrapolation; the first type of target electrochemical parameters including an approximate value of the first type of electrochemical parameters or the first type of electrochemical parameters at a specific rate; identifying the first type of electrochemical parameters, which includes solid-phase lithium concentration and exchange current, through a full-order electrochemical model by taking the first type of target electrochemical parameters as actual values of the first type of electrochemical parameters of the full-order electrochemical model; and identifying a second type of electrochemical parameters, which includes liquid-phase potential and liquid-phase lithium concentration, through the full-order electrochemical model.

5 Claims, 2 Drawing Sheets

METHOD AND SYSTEM FOR STEP PARAMETER IDENTIFICATION BASED ON ELECTROCHEMICAL MODEL

CROSS-REFERENCE TO RELATED PATENT APPLICATION

This application claims priority to and the benefit of Chinese Patent Application No. 202211164115.5, filed Sep. 23, 2022, which is incorporated herein in its entirety by reference.

FIELD OF THE INVENTION

The invention relates generally to the field of battery management technology, in particular to a method and system for step parameter identification based on an electrochemical model.

BACKGROUND OF THE INVENTION

In the context of global "carbon neutrality," enthusiasm for finding clean energy sources as alternatives to petroleum continues to rise. Solar energy, tidal energy, wind energy, hydroelectric power, and the like are clean and sustainable energy sources, but the controllability of the mediums that generate energy is relatively weak. Lithium-ion batteries, which are currently the next-generation rechargeable batteries, offer high energy density and cycle life and are widely used in various fields such as mobile communication, digital technology, electric vehicles, energy storage, and the like. The future demand for lithium-ion batteries and their materials is difficult to estimate, and the associated upstream and downstream industrial chains also have significant market potential. Establishing a physical-chemical model for lithium-ion batteries to obtain simulated numerical values of physical-chemical state variables in the spatial-temporal domain within the battery can provide a clearer understanding of monitoring the real-time operational status of lithium-ion batteries. This, in turn, helps ensure the economic viability, reliability, and safety of lithium-ion batteries.

Currently, the main electrochemical models for lithium-ion batteries include a Lumped Particle Model (LPM), a Single Particle Model (SPM), and a Pseudo 2 Dimension Model (P2D). Due to the complexity of the Pseudo 2 Dimension Model, it can be challenging to solve, which is why the first two models were derived by simplifying some of the physical-chemical processes. The simplification of these models reduces the coupling of physical fields in the model, making the solutions much simpler, but it reduces the accuracy of the electrochemical model, and it is only accurate for low discharge rates (below 1 C).

In an electrochemical model, many electrochemical parameters representing the current physical and chemical properties of lithium-ion batteries are required as input parameters for simulating the operation of the battery. These parameters need to reflect the current physical and chemical properties of the battery to a certain extent to achieve considerable accuracy and predictive capability. The identification of these battery parameters involves using specific algorithms to find a set of parameters within the framework of the electrochemical model that can produce voltage-time data very close to that of a real experiment.

Currently, parameter identification is performed based on a model. This means that either parameter identification is performed at low discharge rates using SPM or LPM, or it is performed using P2D. However, attempting direct parameter identification using the full-order electrochemical model can be computationally challenging. This is because the parameter space for the full model is high-dimensional, leading to a dimensionality explosion in the parameter identification process, which can significantly increase computation time.

Therefore, a heretofore unaddressed need exists in the art to address the aforementioned deficiencies and inadequacies.

SUMMARY OF THE INVENTION

The invention aims to provide a method for step parameter identification based on an electrochemical model, to address the issue of low efficiency in conventional parameter identification processes.

The technical scheme provided by the invention is as follows:

a method for step parameter identification based on an electrochemical model, including the following steps:

identifying a first type of electrochemical parameters through a reduced-order electrochemical model by utilizing different preset charge-discharge rate data;

determining a first type of target electrochemical parameters identified by the reduced-order electrochemical model through extrapolation;

identifying the first type of electrochemical parameters through a full-order electrochemical model by taking the first type of target electrochemical parameters as actual values of the first type of electrochemical parameters of the full-order electrochemical model;

and identifying a second type of electrochemical parameters through the full-order electrochemical model.

In some embodiments, the determining the first class of target electrochemical parameters identified by the reduced-order electrochemical model through extrapolation includes:

comparing change trends of the first type of electrochemical parameters for different preset charge-discharge rate data with successively lower addition rates;

based on the change trends of the first type of electrochemical parameters, obtaining the approximate value of the first type of electrochemical parameters or deriving the first type of electrochemical parameters at the specific rate through extrapolation or interpolation based on the rate and an identification value of the first type of electrochemical parameters; and taking the approximate value of the first type of electrochemical parameters or the first type of electrochemical parameters at the specific rate as the first type of target electrochemical parameters.

In some embodiments, the identifying the first type of electrochemical parameters through the reduced-order electrochemical model by utilizing different preset charge-discharge rate data includes:

identifying the solid-phase potential by a calculation formula of:

$$\phi_s = \phi_s(C_s/C_{max});$$

wherein $\emptyset_s$ is the solid-phase potential, $C_s$ is the solid-phase lithium concentration, and $C_{max}$ is a maximum lithium ion concentration in solid-phase material;

identifying the solid-phase lithium concentration by a calculation formula of:

$$\frac{\partial c_s^{\pm}(x, r, t)}{\partial t} = \frac{1}{r^2} \frac{\partial}{\partial r} \left[ D_s^{\pm} r^2 \frac{\partial c_s^{\pm}}{\partial r}(x, r, t) \right];$$

identifying the exchange current by a calculation formula of:

$$J_n = \frac{I_{app}}{aFL};$$

wherein $J_n$ is a solid-liquid exchange current density, $I_{app}$ is an external current density, a is a unit volume surface area, F is a Faraday constant, L is a solution domain spatial scale, x is a Cartesian space coordinate, r is a spherical coordinate, and t is a time coordinate.

In some embodiments, the identifying the first type of electrochemical parameters through the full-order electrochemical model by taking the first type of target electrochemical parameters as actual values of the first type of electrochemical parameters of the full-order electrochemical model includes:

identifying the solid-phase potential by a calculation formula of:

$$\frac{\partial}{\partial x}[\sigma^{eff}\frac{\partial \phi_s^{\pm}(x, t)}{\partial x}] - a^{\pm}F j_n^{\pm}(x, t) = 0;$$

identifying the solid-phase lithium concentration by a calculation formula of:

$$\frac{\partial c_s^{\pm}(x, r, t)}{\partial t} = \frac{1}{r^2}\frac{\partial}{\partial r}[D_s^{\pm}r^2\frac{\partial c_s^{\pm}}{\partial r}(x, r, t)];$$

wherein $\emptyset_s$ is the solid-phase potential, $C_s$ is the solid-phase lithium concentration, and $\sigma^{eff}$ is a solid phase conductivity; and identifying the exchange current by a calculation formula of:

$$j_n^{\pm}(x, t) = \frac{i_0^{\pm}(x, t)}{F}[\exp(\frac{\alpha^+F}{RT}\eta^{\pm}(x, t)) - \exp(-\frac{\alpha^-F}{RT}\eta^{\pm}(x, t))];$$

wherein $$i_0^{\mp}$$

is a reference exchange current density, $\alpha$ is an oxidation-reduction reaction parameter, and $\eta$ is an overpotential.

In some embodiments, the second type of electrochemical parameters comprises the liquid-phase potential and the liquid-phase lithium concentration, and the identifying the second type of electrochemical parameters through the full-order electrochemical model includes:

identifying the liquid-phase potential by a calculation formula of:

$$\frac{\theta \Phi_e}{\partial x}(x, t) = \frac{-i_e(x, t)}{[\kappa_e^{eff}(C_e(x, t))]} + \frac{2RT}{F}(1 - t_+) \times [1 + \frac{\partial \ln f_{c/a}}{\partial \ln C_e}]\frac{\partial \ln C_e(x, t)}{\partial x};$$

wherein $i_e$ is a liquid-phase current density, $C_e$ is the liquid-phase lithium concentration, $$K_e^{eff}$$

is a liquid-phase conductivity, $f_{c/a}$ is an electrolyte activity coefficient, and t is an electromigration coefficient; and identifying the liquid-phase lithium concentration by a calculation formula of:

$$\frac{\partial C_e(x, t)}{\partial t} = \frac{\partial}{\partial x}D_e^{eff}[\frac{\partial C_e(x, t)}{\partial x}] + \frac{\partial}{\partial x}\frac{(1 - t_+)i_e(x, t)}{F\varepsilon_e};$$

wherein $$D_e^{eff}$$

is an effective liquid-phase diffusion coefficient, $t_+$ is a positive ion transport number, F is the Faraday constant, typically 96485 $Cmol^{-1}$, and $\varepsilon_e$ is a spatial liquid-phase volume fraction.

A system for step parameter identification based on an electrochemical model, including:

a reduced-order module, configured to identify a first type of electrochemical parameters through a reduced-order electrochemical model by utilizing different preset charge-discharge rate data;

an extrapolation module, configured to determine a first type of target electrochemical parameters identified by the reduced-order electrochemical model through extrapolation; and a full-order module, configured to identify the first type of electrochemical parameters through a full-order electrochemical model by taking the first type of target electrochemical parameters as actual values of the first type of electrochemical parameters of the full-order electrochemical model;

the full-order module is further configured to identify a second type of electrochemical parameters through the full-order electrochemical model.

In some embodiments, the extrapolation module is configured to:

compare change trends of the first type of electrochemical parameters for different preset charge-discharge rate data with successively lower addition rates;

based on the change trends of the first type of electrochemical parameters, obtain the approximate value of the first type of electrochemical parameters or derive the first type of electrochemical parameters at the specific rate through extrapolation or interpolation based on the rate and an identification value of the first type of electrochemical parameters; and take the approximate value of the first type of electrochemical parameters or the first type of electrochemical parameters at the specific rate as the first type of target electrochemical parameters.

In some embodiments, the first type of electrochemical parameters includes a solid-phase potential, the solid-phase lithium concentration, and the exchange current, and the reduced-order module is configured to:

identify the solid-phase potential by a calculation formula of:

$$\phi_s = \phi_s(C_s/C_{max});$$

5 wherein $\varnothing_s$ is the solid-phase potential, $C_s$ is the solid-phase lithium concentration, and $C_{max}$ is a maximum lithium ion concentration in solid-phase material;

identify the solid-phase lithium concentration by a calculation formula of:

$$\frac{\partial c_s^{\pm}(x, r, t)}{\partial t} = \frac{1}{r^2} \frac{\partial}{\partial r} [D_s^{\pm} r^2 \frac{\partial c_s^{\pm}}{\partial r}(x, r, t)];$$

wherein $$D_s^{\pm}$$

is a solid-phase diffusion coefficient; and identify the exchange current by a calculation formula of:

$$J_n = \frac{I_{app}}{aFL};$$

wherein $J_n$ is a solid-liquid exchange current density, $I_{app}$ is an external current density, a is a unit volume surface area, F is a Faraday constant, L is a solution domain spatial scale, x is a Cartesian space coordinate, r is a spherical coordinate, and t is a time coordinate.

In some embodiments, the full-order module is configured to:

identify the solid-phase potential by a calculation formula of:

$$\frac{\partial}{\partial x} [\sigma^{eff} \frac{\partial \phi_s^{\pm}(x, t)}{\partial x}] - a^{\pm} F j_n^{\pm}(x, t) = 0;$$

identify the solid-phase lithium concentration by a calculation formula of:

$$\frac{\partial c_s^{\pm}(x, r, t)}{\partial t} = \frac{1}{r^2} \frac{\partial}{\partial r} [D_s^{\pm} r^2 \frac{\partial c_s^{\pm}}{\partial r}(x, r, t)];$$

wherein $\varnothing_s$ is the solid-phase potential, $C_s$ is the solid-phase lithium concentration, and $\sigma^{eff}$ is a solid phase conductivity; and identify the exchange current by a calculation formula of:

$$j_n^{\pm}(x, t) = \frac{i_0^{\pm}(x, t)}{F} [\exp(\frac{\alpha^+ F}{RT} \eta^{\pm}(x, t)) - \exp(- \frac{\alpha^- F}{RT} \eta^{\pm}(x, t))];$$

wherein $$i_0^{\pm}$$

is a reference exchange current density, $\alpha$ is an oxidation-reduction reaction parameter, and $\eta$ is an overpotential.

In some embodiments, the second type of electrochemical parameters includes the liquid-phase potential and the liquid-phase lithium concentration, and the full-order module is configured to:

identify the liquid-phase potential by a calculation formula of:

$$\frac{\partial \Phi_e}{\partial x}(x, t) = \frac{-i_e(x, t)}{[\kappa_e^{eff}(C_e(x, t))]} + \frac{2RT}{F} (1 - t_+) \times [1 + \frac{\partial \ln f_{c/a}}{\partial \ln C_e}] \frac{\partial \ln C_e(x, t)}{\partial x};$$

wherein $i_e$ is a liquid-phase current density, $C_e$ is the liquid-phase lithium concentration, $$\kappa_e^{eff}$$

is a liquid-phase conductivity, $f_{c/a}$ is an electrolyte activity coefficient, and t is an electromigration coefficient; and identify the liquid-phase lithium concentration by a calculation formula of:

$$\frac{\partial C_e(x, t)}{\partial t} = \frac{\partial}{\partial x} D_e^{eff} [\frac{\partial C_e(x, t)}{\partial x}] + \frac{\partial}{\partial x} \frac{(1 - t_+) i_e(x, t)}{F \varepsilon_e}.$$

Compared with the prior art, the method for step parameter identification based on the electrochemical model provided by the invention can bring the following beneficial effects:

the method firstly identifies the parameters of the reduced-order electrochemical model, then uses an extrapolation method to enable the parameters to be used by the full-order electrochemical model, and then conducts parameter identification of other parameters of the full-order electrochemical model, thereby greatly improving the efficiency of parameter identification.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

DETAILED DESCRIPTION OF THE INVENTION

Figure 1:
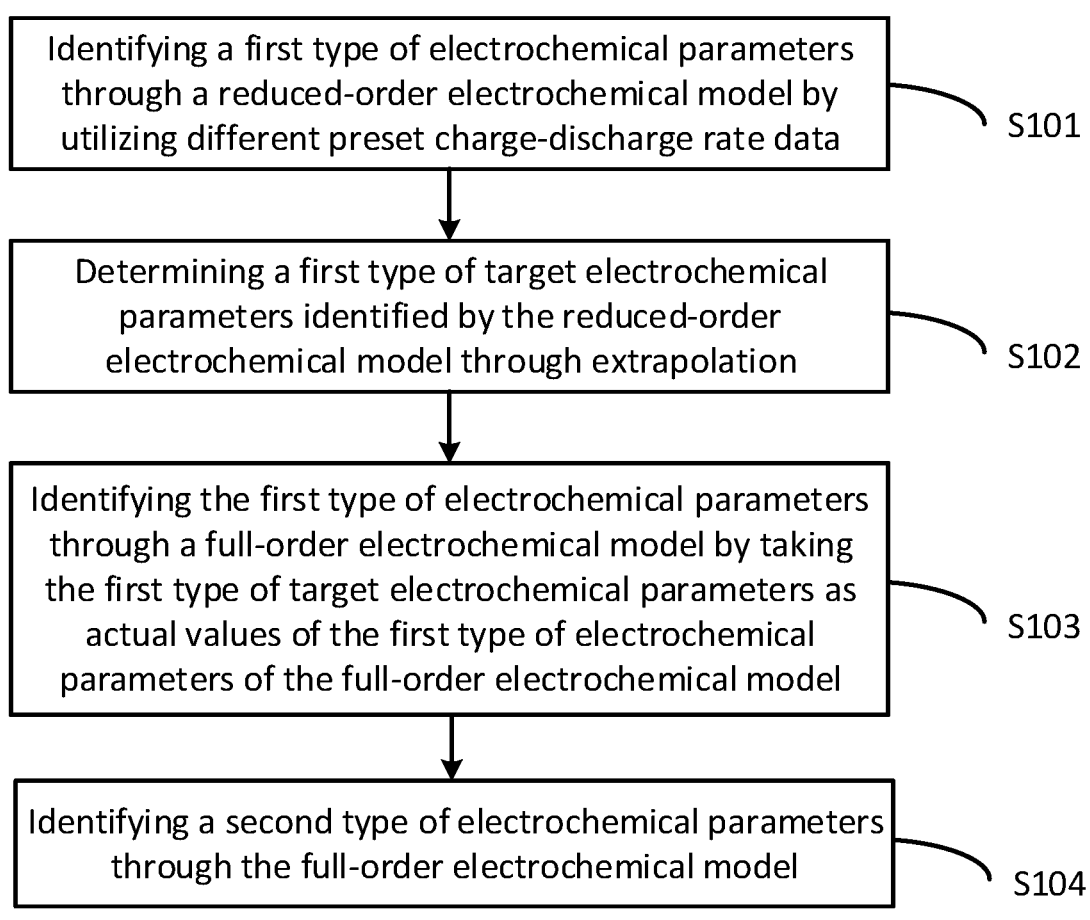
FIG. 1 is a flowchart of a method for step parameter identification based on an electrochemical model according to embodiments of the invention.

Embodiments of the invention are described below through specific examples in conjunction with the accompanying drawings in FIGS. 1-3, and those skilled in the art can easily understand other advantages and effects of the invention from the content disclosed in this specification. The invention can also be implemented or applied through other different specific implementations, and various modifications or changes can be made to the details in this specification according to different viewpoints and applications without departing from the spirit of the invention. It should be noted that, in the case of no conflict, the following embodiments and features in the embodiments can be combined with each other.

It should be noted that the drawings provided in the following embodiments are merely illustrative in nature and serve to explain the principles of the invention, and are in no way intended to limit the invention, its application, or uses. Only the components related to the invention are shown in the drawings rather than the number, shape and size of the components in actual implementations. For components with the same structure or function in some figures, only one of them is schematically shown, or only one of them is marked. They do not represent the actual structure of the product. Dimensional drawing, the type, quantity and proportion of each component can be changed arbitrarily in its actual implementations. More complicated component layouts may also become apparent in view of the drawings, the specification, and the following claims.

The terminology used herein is for the purpose of describing particular embodiments only and is not intended to be limiting of the invention. As used herein, "a" not only means "only one," but also means "more than one." The term "and/or" used in the description of the present application and the appended claims refers to any combination and all possible combinations of one or more of the associated listed items, and includes these combinations. The terms "first," "second," etc. are only used for distinguishing descriptions, and should not be construed as indicating or implying relative importance.

It should be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

In order to more clearly illustrate the embodiments of the invention or the technical solutions in the prior art, the following description will explain the specific embodiments of the invention with reference to the accompanying drawings. It is evident that the drawings in the following description are only examples of the invention, from which other drawings and other embodiments can be obtained by a person skilled in the art without inventive effort.

In one embodiment, as shown in FIG. 1, the invention provides a method for step parameter identification based on an electrochemical model, including:

S101, identifying a first type of electrochemical parameters through a reduced-order electrochemical model by utilizing different preset charge-discharge rate data.

Specifically, in this embodiment, the reduced-order electrochemical model used is SPM, and the full-order electrochemical model used is P2D.

S102, determining a first type of target electrochemical parameters identified by the reduced-order electrochemical model through extrapolation.

S103, identifying the first type of electrochemical parameters through a full-order electrochemical model by taking the first type of target electrochemical parameters as actual values of the first type of electrochemical parameters of the full-order electrochemical model.

Specifically, in the expressions of the two electrochemical models of SPM and P2D, SPM and P2D are described almost identically in the solid phase, and they share a set of parameters in the solid phase, while many assumptions are made on other aspects for simplification.

In the Single Particle Model (SPM), the local potential and concentration gradients in the solution (electrolyte) phase are ignored, and a lumped solution resistance term is used for model simplification.

Similarly, the potential gradient along the x-axis in the solid phase of the electrode is also ignored.

In addition, since the reaction current distribution on the porous electrode is assumed to be uniform, the porous electrode is regarded as a large number of single particles constrained by the same conditions, and the solid diffusion and intercalation reaction kinetics in the electrode particles are analyzed in a single particle form.

Therefore, in this embodiment, the object identified by the SPM parameters is the solid-phase parameter system shared with P2D, and while identifying at low rates, the parameters identified at different low rates are extrapolated to even lower rates, so as to better approximate the identification results of the full-order electrochemical model.

In this case, the parameters identified through SPM are considered part of the parameters identified by P2D, and thus these parameters are treated as fixed parameters during identification in the P2D model. This greatly accelerates the process for models with parameters of twenty to thirty and above (such as P2D, which has at least this many parameters).

For example: in the case where the parameter algorithm has a second order time complexity, the time required to identify 30 parameters is 900 time units, and the identification of 25 parameters takes 625 time units, while adding 5 parameters through a reduced-order module requires 25 time units, providing a time savings of about 28%. This results in better time savings effect for models with larger parameters. Additionally, for multi-tiered parameter identification, the closer the ratio of the number of the parameters identified by each logic layer to the previous time is to the natural logarithm e, the better the time savings effect. The specific reasons are the same as those for the ternary system, but the ratio of parameter numbers can be non-integer. In the ternary system: if both the highest efficiency and utility are required, the ternary closest to e is most efficient.

S104, identifying a second type of electrochemical parameters through the full-order electrochemical model.

In this embodiment, the second type of electrochemical parameter is a parameter other than the first type of electrochemical parameter.

Based on the full-order electrochemical model, the identification of other parameters can utilize various machine learning methods, such as a gradient descent, a neural network, or a genetic algorithm.

In this embodiment, the invention provides a method that can accelerate parameter identification for a full-order electrochemical model. In the process, the parameters of the reduced-order electrochemical model obtained through extrapolation can be used as the parameters of the full-order electrochemical model, and are extrapolated towards lower charge-discharge rates.

Meanwhile, the reduced-order electrochemical model used in this method is obtained by simplifying the physical and chemical processes of a certain higher-order electrochemical model, and the parameters are parameters with physical and chemical significance instead of mathematical parameters with only mathematical meanings resulting from the reduction process.

In one embodiment, the determining the first class of target electrochemical parameters identified by the reduced-order electrochemical model through extrapolation includes:

comparing change trends of the first type of electrochemical parameters for different preset charge-discharge rate data with successively lower addition rates;

based on the change trends of the first type of electrochemical parameters, obtaining the approximate value of the first type of electrochemical parameters or deriving the first type of electrochemical parameters at the specific rate through extrapolation or interpolation based on the rate and an identification value of the first type of electrochemical parameters; and taking the approximate value of the first type of electrochemical parameters or the first type of electrochemical parameters at the specific rate as the first type of target electrochemical parameters.

In this embodiment, the parameter variation trends in parameter identification after adding lower rate data are continuously compared, and parameters are extrapolated to a very low charge/discharge rate, which is generally required to be less than 0.1 C. Finally, parameters obtained at this extremely low charge/discharge rate are used as the actual values for the relevant parameters of the full-order electrochemical model.

The lower rate data uses gradually decreasing low rate data, and as the rate decreases, some parameters will come closer to a certain fixed value, or parameter values at a certain rate can be deduced through extrapolation or interpolation based on the rate and parameter identification values.

In one embodiment, the first type of electrochemical parameters includes a solid-phase potential, the solid-phase lithium concentration, and the exchange current, and the identifying the first type of electrochemical parameters through the reduced-order electrochemical model by utilizing different preset charge-discharge rate data includes:

identifying the solid-phase potential by a calculation formula of:

$$\phi_s = \phi_s(C_s/C_{max});$$

wherein $\emptyset_s$ is the solid-phase potential, $C_s$ is the solid-phase lithium concentration, and $C_{max}$ is a maximum lithium ion concentration in solid-phase material;

identifying the solid-phase lithium concentration by a calculation formula of:

$$\frac{\partial c_s^{\pm}(x, r, t)}{\partial t} = \frac{1}{r^2}\frac{\partial}{\partial r}\left[D_s^{\pm} r^2 \frac{\partial c_s^{\pm}}{\partial r}(x, r, t)\right];$$

wherein $$D_s^{\pm}$$

is a solid-phase diffusion coefficient; and identifying the exchange current by a calculation formula of:

$$J_n = \frac{I_{app}}{aFL};$$

wherein $J_n$ is a solid-liquid exchange current density, $I_{app}$ is an external current density, a is a unit volume surface area, F is a Faraday constant, L is a solution domain spatial scale, x is a Cartesian space coordinate, r is a spherical coordinate, and t is a time coordinate.

In one embodiment, the identifying the first type of electrochemical parameters through the full-order electrochemical model by taking the first type of target electrochemical parameters as actual values of the first type of electrochemical parameters of the full-order electrochemical model includes:

identifying the solid-phase potential by a calculation formula of:

$$\frac{\partial}{\partial x}\left[\sigma^{eff}\frac{\partial \phi_s^{\pm}(x, t)}{\partial x}\right] - a^{\pm}Fj_n^{\pm}(x, t) = 0;$$

identifying the solid-phase lithium concentration by a calculation formula of:

$$\frac{\partial c_s^{\pm}(x, r, t)}{\partial t} = \frac{1}{r^2}\frac{\partial}{\partial r}\left[D_s^{\pm} r^2 \frac{\partial c_s^{\pm}}{\partial r}(x, r, t)\right];$$

wherein $\emptyset_s$ is the solid-phase potential, $C_s$ is the solid-phase lithium concentration, and $\sigma^{eff}$ is a solid phase conductivity; and identifying the exchange current by a calculation formula of:

$$j_n^{\pm}(x, t) = \frac{i_0^{\pm}(x, t)}{F}\left[\exp\left(\frac{\alpha^+ F}{RT}\eta^{\pm}(x, t)\right) - \exp\left(-\frac{\alpha F}{RT}\eta^{\pm}(x, t)\right)\right];$$

wherein $$i_0^{\pm}$$

is a reference exchange current density, a is an oxidation-reduction reaction parameter, and η is an overpotential.

Specifically, as shown in the following table, for the SPM and P2D models, the formulas are compared as follows:

| Parameter | P2D | SPM |
|---|---|---|
| $\phi_s$ · solid-phase potential | $\frac{\partial}{\partial x}\left[\sigma^{eff}\frac{\partial \phi_s^{\pm}(x, t)}{\partial x}\right] - a^{\pm}Fj_n^{\pm}(x, t) = 0$ | $\phi_s = \phi_s\,(C_s/C_{max})$ |
| $\phi_e$ liquid-phase potential | $\frac{\partial \Phi_e}{\partial x}(x, t) = \frac{-i_e(x, t)}{\left[\kappa_e^{eff}(C_e(x, t))\right]} + \frac{2RT}{F}(1 - t_+) \times \left[1 + \frac{\partial \ln f_{c/a}}{\partial \ln C_e}\right]\frac{\partial \ln C_e(x, t)}{\partial x}$ | — |

-continued

| Parameter | P2D | SPM |
|---|---|---|
| $J_n$ exchange current | $$j_n^{\pm}(x, t) = \frac{i_0^{\pm}(x, t)}{F}\left[\exp\left(\frac{\alpha^+ F}{RT}\eta^{\pm}(x, t)\right) - \exp\left(-\frac{\alpha^- F}{RT}\eta^{\pm}(x, t)\right)\right]$$ | $$J_n = \frac{I_{app}}{aFL}$$ |
| $C_s$ solid-phase lithium concentration | $$\frac{\partial c_s^{\pm}(x, r, t)}{\partial t} = \frac{1}{r^2}\frac{\partial}{\partial r}\left[D_s^{\pm} r^2 \frac{\partial c_s^{\pm}}{\partial r}(x, r, t)\right]$$ | $$\frac{\partial c_s^{\pm}(x, r, t)}{\partial t} = \frac{1}{r^2}\frac{\partial}{\partial r}\left[D_s^{\pm} r^2 \frac{\partial c_s^{\pm}}{\partial r}(x, r, t)\right]$$ |
| $C_e$ liquid-phase lithium concentration | $$\frac{\partial C_e(x, t)}{\partial t} = \frac{\partial}{\partial x} D_e^{eff}\left[\frac{\partial C_e(x, t)}{\partial x}\right] + \frac{\partial}{\partial x}\frac{(1 - t_+) i_e(x, t)}{F\varepsilon_e}$$ | — |

The expressions show SPM and P2D have nearly identical descriptions for the solid phase and share the same parameter system for the solid phase, and other aspects make many assumptions for simplification.

The solid-phase potential, exchange current, and solid-phase lithium concentration calculated in SPM can be directly used as the final identification parameters of P2D or can be substituted as known constants into P2D to simplify its calculations and parameter identification.

In some embodiments, the second type of electrochemical parameters includes the liquid-phase potential and the liquid-phase lithium concentration, and the identifying the second type of electrochemical parameters through the full-order electrochemical model includes:

identifying the liquid-phase potential by a calculation formula of:

$$\frac{\partial \Phi_e}{\partial x}(x, t) = \frac{-i_e(x, t)}{\left[\kappa_e^{eff}(C_e(x, t))\right]} + \frac{2RT}{F}(1 - t_+) \times \left[1 + \frac{\partial \ln f_{c/a}}{\partial \ln C_e}\right]\frac{\partial \ln C_e(x, t)}{\partial x};$$

wherein $i_e$ is a liquid-phase current density, $C_e$ is the liquid-phase lithium concentration, $$\kappa_e^{eff}$$

is a liquid-phase conductivity, $f_{c/a}$ is an electrolyte activity coefficient, and t is an electromigration coefficient; and identifying the liquid-phase lithium concentration by a calculation formula of:

$$\frac{\partial C_e(x, t)}{\partial t} = \frac{\partial}{\partial x} D_e^{eff}\left[\frac{\partial C_e(x, t)}{\partial x}\right] + \frac{\partial}{\partial x}\frac{(1 - t_+) i_e(x, t)}{F\varepsilon_e};$$

wherein $$D_e^{eff}$$

is an effective liquid-phase diffusion coefficient, $t_+$ is a positive ion transport number, F is the Faraday constant, typically 96485 Cmol$^{-1}$, and $\varepsilon_e$ is a spatial liquid-phase volume fraction.

Figure 2:
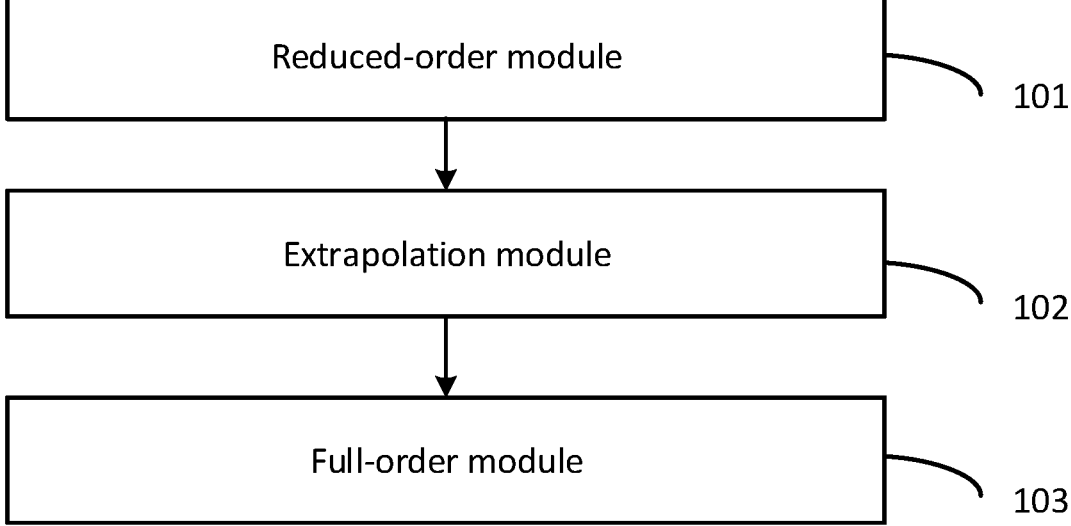
FIG. 2 is a flowchart of a system for step parameter identification based on an electrochemical model according to embodiments of the invention.
Figure 3:
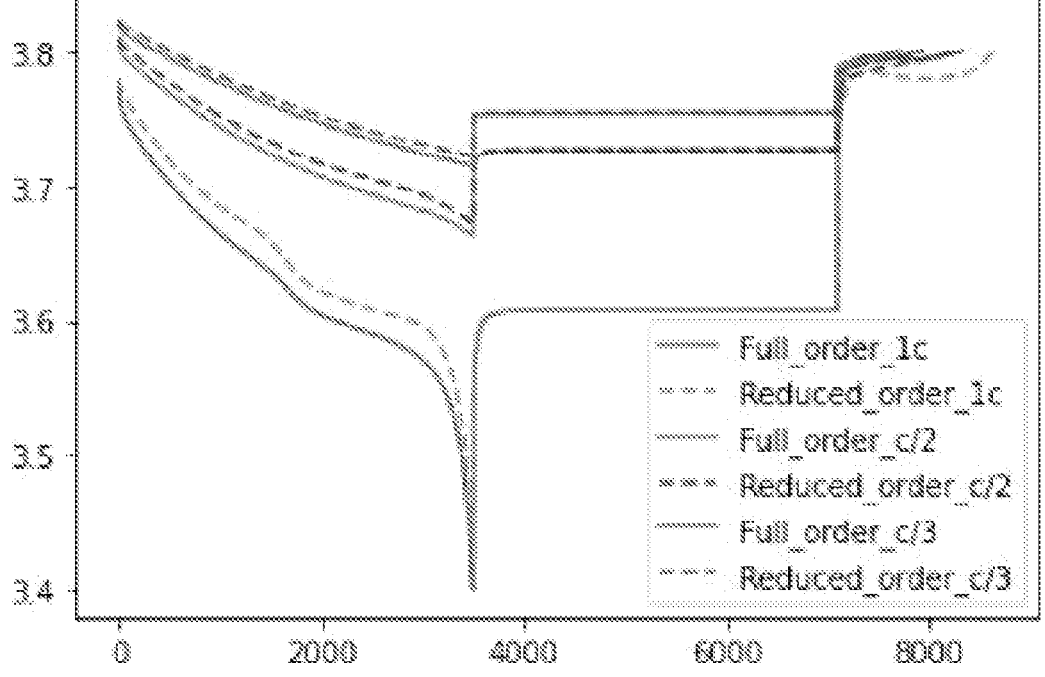
FIG. 3 is a graph of sensitivity parameters of the invention.

In one embodiment, as shown in FIG. 2, the invention further provides a system for step parameter identification based on an electrochemical model, including:

a reduced-order module 101, configured to identify a first type of electrochemical parameters through a reduced-order electrochemical model by utilizing different preset charge-discharge rate data;

an extrapolation module 102, configured to determine a first type of target electrochemical parameters identified by the reduced-order electrochemical model through extrapolation; and a full-order module 103, configured to identify the first type of electrochemical parameters through a full-order electrochemical model by taking the first type of target electrochemical parameters as actual values of the first type of electrochemical parameters of the full-order electrochemical model;

wherein the full-order module 103 is further configured to identify a second type of electrochemical parameters through the full-order electrochemical model.

In one embodiment, the extrapolation module is configured to:

compare change trends of the first type of electrochemical parameters for different preset charge-discharge rate data with successively lower addition rates;

based on the change trends of the first type of electrochemical parameters, obtain the approximate value of the first type of electrochemical parameters or derive the first type of electrochemical parameters at the specific rate through extrapolation or interpolation based on the rate and an identification value of the first type of electrochemical parameters; and take the approximate value of the first type of electrochemical parameters or the first type of electrochemical parameters at the specific rate as the first type of target electrochemical parameters.

In one embodiment, the first type of electrochemical parameters includes a solid-phase potential, the solid-phase lithium concentration, and the exchange current, and the reduced-order module is configured to:

identify the solid-phase potential by a calculation formula of:

$$\phi_s = \phi_s(C_s/C_{max});$$

wherein $\emptyset_s$ is the solid-phase potential, $C_s$ is the solid-phase lithium concentration, and $C_{max}$ is a maximum lithium ion concentration in solid-phase material;

identify the solid-phase lithium concentration by a calculation formula of:

$$\frac{\partial c_s^{\pm}(x, r, t)}{\partial t} = \frac{1}{r^2}\frac{\partial}{\partial r}\left[D_s^{\pm} r^2 \frac{\partial c_s^{\pm}}{\partial r}(x, r, t)\right];$$

wherein $$D_s^{\pm}$$

is a solid-phase diffusion coefficient; and
identify the exchange current by a calculation formula of:

$$J_n = \frac{I_{app}}{aFL};$$

wherein $J_n$ is a solid-liquid exchange current density, $I_{app}$ is an external current density, a is a unit volume surface area, F is a Faraday constant, L is a solution domain spatial scale, x is a Cartesian space coordinate, r is a spherical coordinate, and t is a time coordinate.

In some embodiments, the full-order module is configured to:
identify the solid-phase potential by a calculation formula of:

$$\frac{\partial}{\partial x}\left[\sigma^{eff} \frac{\partial \phi_s^{\pm}(x, t)}{\partial x}\right] - a^{\pm}F j_n^{\pm}(x, t) = 0;$$

identify the solid-phase lithium concentration by a calculation formula of:

$$\frac{\partial c_s^{\pm}(x, r, t)}{\partial t} = \frac{1}{r^2}\frac{\partial}{\partial r}\left[D_s^{\pm} r^2 \frac{\partial c_s^{\pm}}{\partial r}(x, r, t)\right];$$

wherein $\varnothing_s$ is the solid-phase potential, $C_s$ is the solid-phase lithium concentration, and $\sigma^{eff}$ is a solid phase conductivity; and
identify the exchange current by a calculation formula of:

$$j_n^{\pm}(x, t) = \frac{i_0^{\pm}(x, t)}{F}\left[\exp\left(\frac{\alpha^{+}F}{RT}\eta^{\pm}(x, t)\right) - \exp\left(-\frac{\alpha^{-}F}{RT}\eta^{\pm}(x, t)\right)\right];$$

wherein $$i_0^{\pm}$$

is a reference exchange current density, $\alpha$ is an oxidation-reduction reaction parameter, and $\eta$ is an overpotential.

In one embodiment, the second type of electrochemical parameters includes the liquid-phase potential and the liquid-phase lithium concentration, and the full-order module is configured to:
identify the liquid-phase potential by a calculation formula of:

$$\frac{\partial \Phi_e}{\partial x}(x, t) = \frac{-i_e(x, t)}{\left[\kappa_e^{eff}(C_e(x, t))\right]} + \frac{2RT}{F}(1 - t_+)\times\left[1 + \frac{\partial \ln f_{c/a}}{\partial \ln C_e}\right]\frac{\partial \ln C_e(x, t)}{\partial x};$$

wherein $i_e$ is a liquid-phase current density, $C_e$ is the liquid-phase lithium concentration, $$K_e^{eff}$$

is a liquid-phase conductivity, $f_{c/a}$ is an electrolyte activity coefficient, and t is an electromigration coefficient; and
identify the liquid-phase lithium concentration by a calculation formula of:

$$\frac{\partial C_e(x, t)}{\partial t} = \frac{\partial}{\partial x}D_e^{eff}\left[\frac{\partial C_e(x, t)}{\partial x}\right] + \frac{\partial}{\partial x}\frac{(1 - t_+)i_e(x, t)}{F\varepsilon_e};$$

wherein $$D_e^{eff}$$

is an effective liquid-phase diffusion coefficient, $t_+$ is a positive ion transport number, F is the Faraday constant, typically 96485 Cmol$^{-1}$, and $\varepsilon_e$ is a spatial liquid-phase volume fraction.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

What is claimed is:
1. A system for step parameter identification based on an electrochemical model, comprising:
a reduced-order module, configured to identify a first type of electrochemical parameters through a reduced-order electrochemical model by utilizing different preset charge-discharge rate data;
an extrapolation module, configured to determine a first type of target electrochemical parameters identified by the reduced-order electrochemical model through extrapolation; the first type of target electrochemical parameters including an approximate value of the first type of electrochemical parameters or the first type of electrochemical parameters at a specific rate; and
a full-order module, configured to identify the first type of electrochemical parameters through a full-order electrochemical model by taking the first type of target electrochemical parameters as actual values of the first type of electrochemical parameters of the full-order electrochemical model; the first type of electrochemical parameters including solid-phase lithium concentration and exchange current;
wherein the full-order module is further configured to identify a second type of electrochemical parameters through the full-order electrochemical model; the sec- ond type of electrochemical parameters including liquid-phase potential and liquid-phase lithium concentration.

2. The system of claim 1, wherein the extrapolation module is configured to:

compare change trends of the first type of electrochemical parameters for different preset charge-discharge rate data with successively lower addition rates;

based on the change trends of the first type of electrochemical parameters, obtain the approximate value of the first type of electrochemical parameters or derive the first type of electrochemical parameters at the specific rate through extrapolation or interpolation based on the rate and an identification value of the first type of electrochemical parameters; and take the approximate value of the first type of electrochemical parameters or the first type of electrochemical parameters at the specific rate as the first type of target electrochemical parameters.

3. The system of claim 2, wherein the first type of electrochemical parameters comprises a solid-phase potential, the solid-phase lithium concentration, and the exchange current, and the reduced-order module is configured to:

identify the solid-phase potential by a calculation formula of:

$$\phi_s = \phi_s(C_s/C_{max});$$

wherein $\emptyset_s$ is the solid-phase potential, $C_s$ is the solid-phase lithium concentration, and $C_{max}$ is a maximum lithium ion concentration in solid-phase material;

identify the solid-phase lithium concentration by a calculation formula of:

$$\frac{\partial c_s^{\pm}(x, r, t)}{\partial t} = \frac{1}{r^2} \frac{\partial}{\partial r}\left[D_s^{\pm} r^2 \frac{\partial c_s^{\pm}}{\partial r}(x, r, t)\right];$$

wherein $$D_s^{\pm}$$

is a solid-phase diffusion coefficient; and identify the exchange current by a calculation formula of:

$$J_n = \frac{I_{app}}{aFL};$$

wherein $J_n$ is a solid-liquid exchange current density, $I_{app}$ is an external current density, a is a unit volume surface area, F is a Faraday constant, L is a solution domain spatial scale, x is a Cartesian space coordinate, r is a spherical coordinate, and t is a time coordinate.

4. The system of claim 3, wherein the full-order module is configured to:

identify the solid-phase potential by a calculation formula of:

$$\frac{\partial}{\partial x}\left[\sigma^{eff} \frac{\partial \phi_s^{\pm}(x, t)}{\partial x}\right] - a^{\pm} F j_n^{\pm}(x, t) = 0;$$

identify the solid-phase lithium concentration by a calculation formula of:

$$\frac{\partial c_s^{\pm}(x, r, t)}{\partial t} = \frac{1}{r^2} \frac{\partial}{\partial r}\left[D_s^{\pm} r^2 \frac{\partial c_s^{\pm}}{\partial r}(x, r, t)\right];$$

wherein $\emptyset_s$ is the solid-phase potential, $C_s$ is the solid-phase lithium concentration, and $\sigma^{eff}$ is a solid phase conductivity; and identify the exchange current by a calculation formula of:

$$j_n^{\pm}(x, t) = \frac{i_0^{\pm}(x, t)}{F}\left[\exp\left(\frac{\alpha^+ F}{RT}\eta^{\pm}(x, t)\right) - \exp\left(-\frac{\alpha^- F}{RT}\eta^{\pm}(x, t)\right)\right];$$

wherein $$i_0^{\mp}$$

Is a reference exchange current density, $\alpha$ is an oxidation-reduction reaction parameter, and $\eta$ is an overpotential.

5. The system of claim 4, wherein the second type of electrochemical parameters comprises the liquid-phase potential and the liquid-phase lithium concentration, and the full-order module is configured to:

identify the liquid-phase potential by a calculation formula of:

$$\frac{\partial \Phi_e}{\partial x}(x, t) = \frac{-i_e(x, t)}{\left[\kappa_e^{eff}(C_e(x, t))\right]} + \frac{2RT}{F}(1 - t_+) \times \left[1 + \frac{\partial \ln f_{c/a}}{\partial \ln C_e}\right]\frac{\partial \ln C_e(x, t)}{\partial x};$$

wherein $i_e$ is a liquid-phase current density, $C_e$ is the liquid-phase lithium concentration, $$K_e^{eff}$$

is a liquid-phase conductivity, $f_{c/a}$ is an electrolyte activity coefficient, and t is an electromigration coefficient; and identify the liquid-phase lithium concentration by a calculation formula of:

$$\frac{\partial C_e(x, t)}{\partial t} = \frac{\partial}{\partial x}D_e^{eff}\left[\frac{\partial C_e(x, t)}{\partial x}\right] + \frac{\partial}{\partial x}\frac{(1 - t_+)i_e(x, t)}{F\varepsilon_e};$$

wherein $$D_e^{eff}$$

is an effective liquid-phase diffusion coefficient, $t_+$ is a positive ion transport number, F is the Faraday constant, typically 96485 Cmol$^{-1}$, and $\varepsilon_e$ is a spatial liquid-phase volume fraction.

* * * * *